(12) United States Patent
Yang et al.

(10) Patent No.: US 7,847,611 B2
(45) Date of Patent: Dec. 7, 2010

(54) LEVEL SHIFTER WITH REDUCED POWER CONSUMPTION AND LOW PROPAGATION DELAY

(75) Inventors: Chih-Wen Yang, Miaoli (TW); Sheng-Hua Chen, Kaohsiung (TW)

(73) Assignee: Faraday Technology Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/357,179

(22) Filed: Jan. 21, 2009

(65) Prior Publication Data

US 2009/0189670 A1 Jul. 30, 2009

(30) Foreign Application Priority Data

Jan. 28, 2008 (TW) .............................. 97103184 A

(51) Int. Cl.
*H03L 5/00* (2006.01)
(52) U.S. Cl. ............................. 327/333; 326/62; 326/81
(58) Field of Classification Search ............. 326/62–63, 326/80–81; 327/306, 333
See application file for complete search history.

(56) References Cited

U.S. PATENT DOCUMENTS

| 4,486,670 | A | 12/1984 | Chan et al. |
|---|---|---|---|
| 4,978,870 | A | 12/1990 | Chen et al. |
| 5,113,097 | A | 5/1992 | Lee |
| 5,223,751 | A | 6/1993 | Simmons et al. |
| 5,528,172 | A | 6/1996 | Sundstrom |
| 5,528,173 | A | 6/1996 | Merritt et al. |
| 5,650,742 | A | 7/1997 | Hirano |
| 5,666,070 | A | 9/1997 | Merritt et al. |
| 6,002,290 | A | 12/1999 | Avery et al. |
| 6,201,429 | B1 * | 3/2001 | Rosenthal ................... 327/333 |
| 6,977,523 | B2 * | 12/2005 | Tamaki ........................ 326/68 |
| 7,145,363 | B2 | 12/2006 | Kim |

OTHER PUBLICATIONS

Fujio Ishihara, Farhana Sheikh, and Borivoje nikolic, Level Conversion for Dual-Supply Systems, IEEE Transactions on Very Large Scale Integration, VLSI, Systems. vol. 12, No. 2, Feb. 2004, p. 185-p. 195.

* cited by examiner

*Primary Examiner*—Dinh T. Le
(74) *Attorney, Agent, or Firm*—Winston Hsu; Scott Margo

(57) ABSTRACT

A level shifter includes a Not gate coupled to a signal input and operable between a first high level and a low level; a first PMOS transistor coupled to a second voltage source and a control end; a first NMOS transistor coupled to the first PMOS transistor, a Not-gate output end and a reference voltage; and a control circuit coupled to the signal input, the Not-gate output end and the second voltage source. When the signal input and the Not-gate output end are at the first high level and the low level, respectively, the first PMOS transistor is turned on so that the signal output is at a second high level; and when the signal input and the Not-gate output end are switched contrarily, the first PMOS transistor is turned off and the signal output is at the low level.

8 Claims, 10 Drawing Sheets

LEVEL SHIFTER WITH REDUCED POWER CONSUMPTION AND LOW PROPAGATION DELAY

FIELD OF THE INVENTION

The present invention relates to a level shifter, and more particularly to a level shifter with low power consumption and low propagation delay.

BACKGROUND OF THE INVENTION

In general, a level shifter is used for transmitting signals between circuits coupled to difference voltage sources.

Please refer to FIG. 1 which schematically illustrates a conventional level shifter. The level shifter includes PMOS transistors P6 and P7, NMOS transistors N6 and N7, and Not gates 10 and 20.

The level shifter is designed to function like a cross-coupled level converter (CCLC). As shown, the sources of the PMOS transistors P6 and P7 are coupled to a high voltage source VDDH; the gate of the PMOS transistor P6 is coupled to the drain of the PMOS transistor P7; the gate of the PMOS transistor P7 is coupled to the drain of the PMOS transistor P6; the drain of the NMOS transistor N6 is coupled to the drain of the PMOS transistor P6; the source of the NMOS transistor N6 is grounded; the drain of the NMOS transistor N7 is coupled to the drain of the PMOS transistor P7; the source of the NMOS transistor N7 is grounded; the Not gate 10 is coupled to a low voltage source VDDL; a signal input IN is coupled to the gate of the NMOS transistor N7 as well as the input end of the Not gate 10; the output end of the Not gate 10 is coupled to the gate of the NMOS transistor N6; the Not gate 20 is coupled to the high voltage source VDDH; the drain of the NMOS transistor N7 is coupled to the input end of the Not gate 20; and the output end of the Not gate 20 serves as the signal output OUT. Therefore, it is thus understood the high level of the signal input IN is the level of VDDL, while the low level is the ground level. On the other hand, the high level of the signal output OUT is the level of VDDH, while the low level is the ground level.

When the signal input IN is switched from the low level to the high level, the NMOS transistor N6 is turned off, and the NMOS transistor N7 is turned on so that the Not gate 20 receives a signal at the low level but outputs the signal at the high level. On the other hand, when the signal input IN is switched from the high level to the low level, the NMOS transistor N7 is turned off, and the NMOS transistor N6 is turned on. Meanwhile, the PMOS transistor P7 is turned on, and the PMOS transistor P6 is turned off so that the Not gate 20 receives a signal at the high level but outputs the signal at the low level.

The above-described level shifter is simple in design. However, it suffers from a number of drawbacks. For example, the cross-coupled PMOS transistors P6 and P7 may have a racing phenomenon when the state at the signal input I changes. The racing phenomenon would adversely affect the duration for the nodes A and B to reach the steady state so as to result in long propagation delay. In addition, the racing phenomenon would make the level shifter consume much power. Furthermore, since the signal input IN is generally switched from the low level to the high level faster than from the high level to the low level, a time non-balance problem for signal conversion would occur.

Another level shifter is illustrated in FIG. 2, which describes a prior art taught in U.S. Pat. No. 7,145,363. The level shifter includes PMOS transistors P8 and P9, NMOS transistors N8, N9, N10 and N11, and Not gates 30, 40 and 50. The level shifter has also a cross-coupled level converter (CCLC) architecture. As shown, the sources of the PMOS transistors P8 and P9 are coupled to a high voltage source VDDH; the gate of the PMOS transistor P8 is coupled to the drain of the PMOS transistor P9; the gate of the PMOS transistor P9 is coupled to the drain of the PMOS transistor P8; the drain of the NMOS transistor N8 is coupled to the drain of the PMOS transistor P8; the source of the NMOS transistor N8 is grounded; the drain of the NMOS transistor N9 is coupled to the drain of the PMOS transistor P9; the source of the NMOS transistor N9 is grounded; the input end of the Not gate 30 is coupled to a signal input IN; the output end (the node C) of the Not gate 30 is coupled to the gate of the NMOS transistor N8 and the input end of the Not gate 40; the output end (the node D) of the Not gate 40 is coupled to the NMOS transistor N9; the output end of the Not gate 50 is coupled to the drain of the NMOS transistor N9; the output end of the Not gate 50 serves as the signal output OUT. Furthermore, the NMOS transistors N10 and N11 function as two auxiliary pull-up devices of the level shifter. The gate of the NMOS transistor N10 is coupled to the node D; the drain of the NMOS transistor N10 is coupled to the high voltage source VDDH; the source of the NMOS transistor N10 is coupled to the drain of the PMOS transistor P8. The gate of the NMOS transistor N11 is coupled to the node C; the drain of the NMOS transistor N11 is coupled to the high voltage source VDDH; the source of the NMOS transistor N11 is coupled to the drain of the PMOS transistor P9.

The level shifter of FIG. 2 exempts from the racing problem mentioned above. In other words, when the signal input IN is switched from the low level to the high level, the node C is at the low level while the node D is at the high level. Meanwhile, the auxiliary pull-up device N10 is turned on to have the level at the node A rapidly pulled up to the high-level ready state. Likewise, when the signal input IN is switched from the high level to the low level, the node C is at the high level while the node D is at the low level. Meanwhile, the auxiliary pull-up device N11 is turned on to have the level at the node B rapidly pulled up to the high-level ready state. In this way, the racing problem is eliminated. However, since the auxiliary pull-up devices are both NMOS transistors and directly coupled to the high voltage source, an electrostatic discharge (ESD) path would be formed and the pull-up devices are likely to be damaged.

SUMMARY OF THE INVENTION

Therefore, an object of the present invention is to provide a level shifter which eliminates the racing problem while exempting from the formation of the ESD path.

According to an aspect of the present invention, a level shifter for shifting a level of a signal input and outputting a signal output with the shifted level comprises a Not gate coupled to a first voltage source so to be operable between a first high level approximating or substantially equal to a level of the first voltage source and a low level approximating to or substantially equal to a level of a reference voltage, and having an input end coupled to the signal input; a first PMOS transistor having a source coupled to a second voltage source and a gate coupled to a control end; a first NMOS transistor having a drain coupled to the drain of the first PMOS transistor and outputting therefrom the signal output, having a gate coupled to an output end of the Not gate, and having a source coupled to the reference voltage; and a control circuit coupled to the signal input, the output end of the Not gate and the second voltage source; wherein when the signal input is at the first high level and the output end of the Not gate is at the low level, the first PMOS transistor is turned on in response to a control signal from the control end of the control circuit so that the signal output is at a second high level associated with the second voltage source; and when the signal input is at the low level and the output end of the Not gate is at the first high level, the first PMOS transistor is turned off in response to the control signal from the control end of the control circuit so that the signal output is at the low level.

According to another aspect of the present invention, a level shifter for shifting a level of a signal input and outputting a signal output with the shifted level comprises a Not gate coupled to a first voltage source so to be operable between a first high level approximating or substantially equal to a level of the first voltage source and a low level approximating or substantially equal to to a reference voltage, and having an input end coupled to the signal input; a first PMOS transistor having a source coupled to a second voltage source and a gate coupled to a control end; a first NMOS transistor having a drain coupled to the drain of the first PMOS transistor and outputting therefrom the signal output, having a gate coupled to an output end of the Not gate, and having a source coupled to the reference voltage; a second NMOS transistor having a gate coupled to the signal input, a drain coupled to the control end, and a source coupled to the reference voltage; and a leakage current preventing unit disposed between the second voltage source and the reference voltage; wherein when the output end of the Not gate is at the low level, the first PMOS transistor is turned on in response to a control signal from the control end so that the signal output is at a second high level associated with the second voltage source; and when the output end of the Not gate is at the first high level, the first PMOS transistor is turned off in response to the control signal from the control end so that the signal output is at the low level.

According to a further aspect of the present invention, a level shifter for shifting a level of a signal input and outputting a signal output with the shifted level comprises a Not gate coupled to a first voltage source so to be operable between a first high level approximating or substantially equal to a level of the first voltage source and a low level approximating or substantially equal to a reference voltage, and having an input end coupled to the signal input; a first PMOS transistor having a source coupled to a second voltage source and a gate coupled to a control end; a first NMOS transistor having a drain coupled to the drain of the first PMOS transistor and outputting therefrom the signal output, having a gate coupled to an output end of the Not gate, and having a source coupled to the reference voltage; a second NMOS transistor having a gate coupled to the signal input, a drain coupled to the control end, and a source coupled to the reference voltage; a racing problem reducing unit coupled to the output end of the Not gate, the control end and the second voltage source, and configured to have the first PMOS transistor turned off in response to the control signal from the control end when the output end of the Not gate is at the first high level, thereby obtaining the signal output at the low level; and a leakage current preventing unit disposed between the second voltage source and the reference voltage, and configured to have the first PMOS transistor turned on in response to a control signal from the control end when the output end of the Not gate is at the low level, thereby obtaining the signal output at a second high level associated with the second voltage source.

BRIEF DESCRIPTION OF THE DRAWINGS

The above contents of the present invention will become more readily apparent to those ordinarily skilled in the art after reviewing the following detailed description and accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 3:
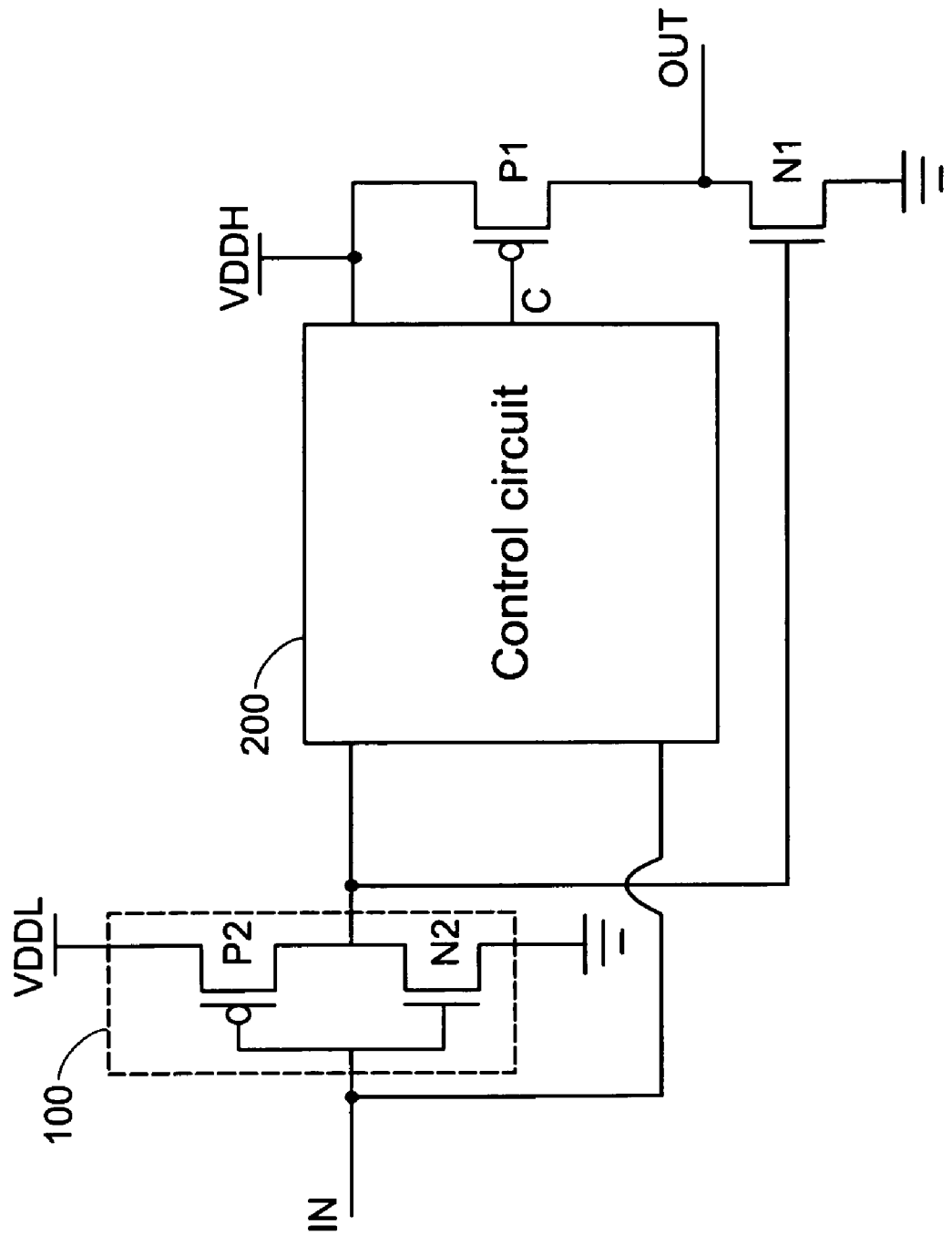
FIG. 3 is a circuit block diagram of a level shifter according to an embodiment of the present invention.

Please refer to FIG. 3. A level shifter according to an embodiment of the present invention includes a Not gate 100, a control circuit 200, a PMOS transistor P1 and an NMOS transistor N1. The Not gate 100 includes a PMOS transistor P2 whose source is coupled to a low voltage source VDDL and whose gate is coupled to a signal input IN, and an NMOS transistor N2 whose drain is coupled to the drain of the PMOS transistor P2, whose gate is coupled to the signal input IN and whose gate is grounded. The Not gate 100 is operable between a specified high level and a specified low level. When the signal input IN to the Not gate 100 is at the specified high level, the output of the Not gate 100 will be at the specified low level; and when the signal input IN to the Not gate 100 is at the specified low level, the output of the Not gate 100 will be at the specified high level. The specified high level approximates or substantially equal to the level of the low voltage source VDDL that the Not gate 100 is coupled to. On the other hand, the specified low level approximates or substantially equal to a reference voltage such as a ground level.

In this embodiment, the control circuit 200 is coupled to the signal input IN, an output end of the Not gate 100 and a high voltage source VDDH, which has a level higher than the low voltage source VDDL. The control circuit 200 generates a control signal at a control end C according to signal levels at the signal input IN and the output end of the Not gate 100.

When the signal input IN is at the specified high level and the output end of the Not gate 100 is at the specified low level, the control signal at the specified low level is outputted from the control end to turn on the PMOS transistor P1. Accordingly, the signal output OUT from the level shifter is at another high level different from the specified high level. On the other hand, when the signal input IN is at the specified low level and the output end of the Not gate 100 is at the specified high level, the control signal is outputted at the different high level. The PMOS transistor P1 is thus turned off, and the signal output OUT is at the specified low level. The different high level approximates or substantially equal to the level of the high voltage source VDDH.

Further in this embodiment, the source of the PMOS transistor P1 is coupled to the high voltage source VDDH; the gate of the PMOS transistor P1 is coupled to the control end C; the drain of the NMOS transistor N1 is coupled to the drain of the PMOS transistor P1 and serves as a signal output OUT; the gate of the NMOS transistor N1 is coupled to the output end of the Not gate 100; and the source of the NMOS transistor N1 is grounded.

Embodiments of the control circuit 200 are described hereinafter with reference to FIG. 4.

Figure 4A:
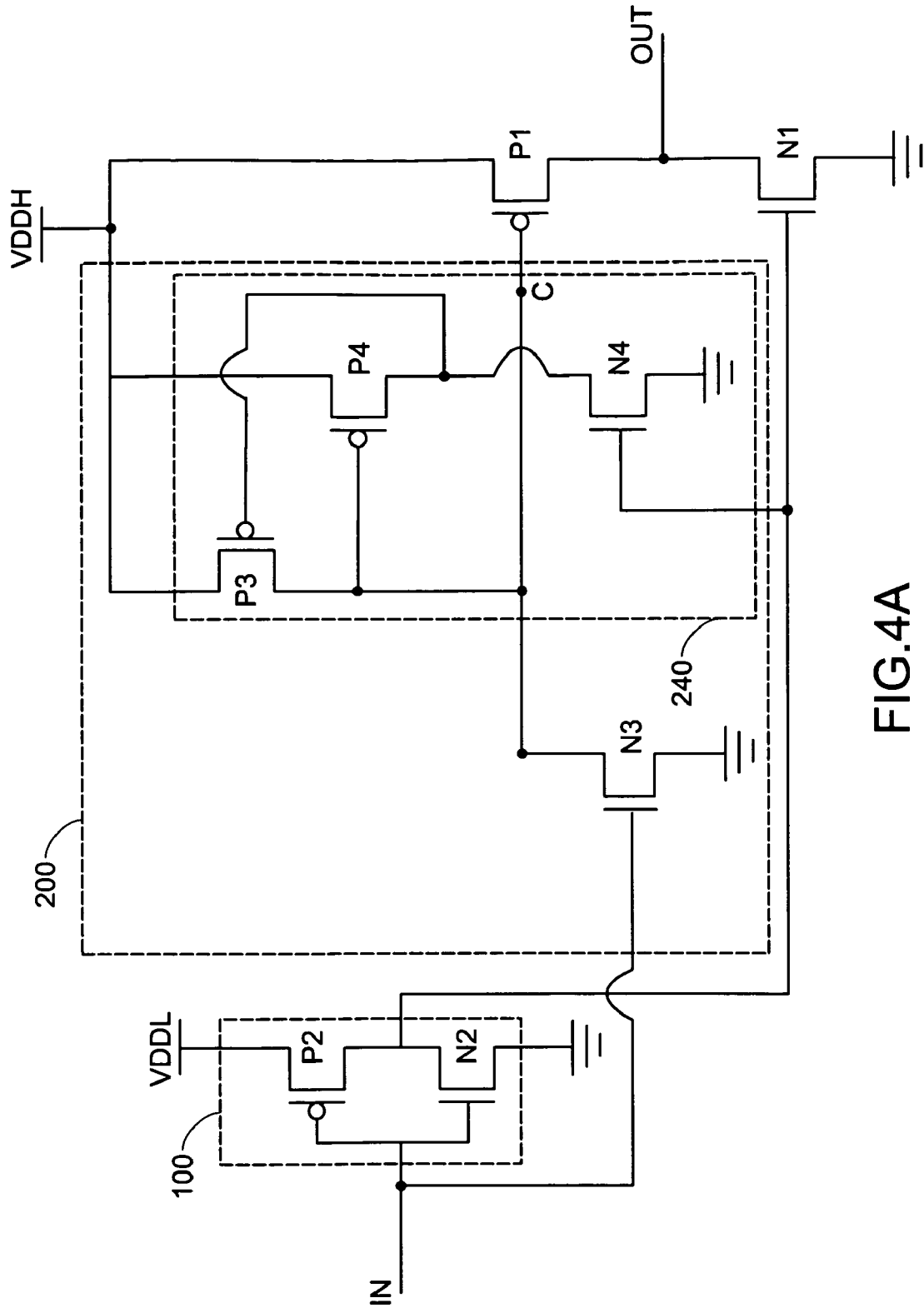
FIG. 4A is a circuit diagram illustrating a first embodiment of a control circuit applicable to the level shifter of FIG. 3.

Please refer to FIG. 4A in which the level shifter of FIG. 3 is used with a first embodiment of the control circuit 200 as shown. As mentioned above, when the signal input IN to the Not gate 100 is at the specified low level, the Not gate 100 outputs the specified high level approximating or substantially equal to the level of the low voltage source VDDL. Since the signal input IN is at the specified low level and the output end of the Not gate 100 is at the specified high level, the control signal outputted from the control end C to the gate of the PMOS transistor P1 is at the high level approximating or substantially equal to the level of the high voltage source VDDH. The PMOS transistor P1 is thus supposed to be turned off. However, since the level of the high voltage source VDDH is higher than that of the low voltage source VDDL, the PMOS transistor P1 is hard to be successfully turned off. In other words, current leakage is likely to occur. For solving this problem, the control circuit 200 in this embodiment includes a leakage-current preventing unit 240 and an NMOS transistor N3. The leakage-current preventing unit 240 provides a high level approximating or substantially equal to the level of the high voltage source VDDH to the control end C while the PMOS transistor P1 is being turned off to assure of the off state of the PMOS transistor P1, thereby preventing from current leakage.

The leakage-current preventing unit 240 includes PMOS transistors P3 and P4 and an NMOS transistor N4, wherein the source of the PMOS transistor P3 and the source of the PMOS transistor P4 are both coupled to the high voltage source VDDH; the drain of the PMOS transistor P4 is coupled to the gate of the PMOS transistor P3; the gate of the PMOS transistor P4 is coupled to the drain of the PMOS transistor P3 and the control end C; the drain of the NMOS transistor N4 is coupled to the drain of the PMOS transistor P4; the source of the NMOS transistor N4 is coupled to ground; and the gate of the NMOS transistor N4 is coupled to the output end of the Not gate 100.

Furthermore, the NMOS transistor N3 in the control circuit of FIG. 4A has the gate thereof coupled to the signal input IN, the drain thereof coupled to the control end C, and the source thereof coupled to ground.

In this architecture, when the signal input IN is at the specified high level, e.g. equal to the level of the low voltage source VDDL, and the output end of the Not gate 100 is at the specified low level, e.g. the ground level, the NMOS transistor N3 and the PMOS transistor P4 are turned on, and the NMOS transistor N4 and the PMOS transistor P3 are turned off. Accordingly, the control signal outputted from the control end is at the specified low level. Meanwhile, the PMOS transistor P1 is turned on and the NMOS transistor N1 is turned off so that the signal output OUT from the level shifter is at another high level different from the specified high level, e.g. equal to the level of the high voltage source VDDH. On the other hand, when the signal input IN is at the specified low level and the output end of the Not gate 100 is at the specified high level, the NMOS transistor N4 and the PMOS transistor P3 are turned on, and the NMOS transistor N3 and the PMOS transistor P4 are turned off. Accordingly, the control signal outputted from the control end is at the high level, e.g. equal to the level of the high voltage source VDDH. Meanwhile, the PMOS transistor P1 is turned off and the NMOS transistor N1 is turned on so that the signal output OUT from the level shifter is at the specified low level.

Figure 4B:
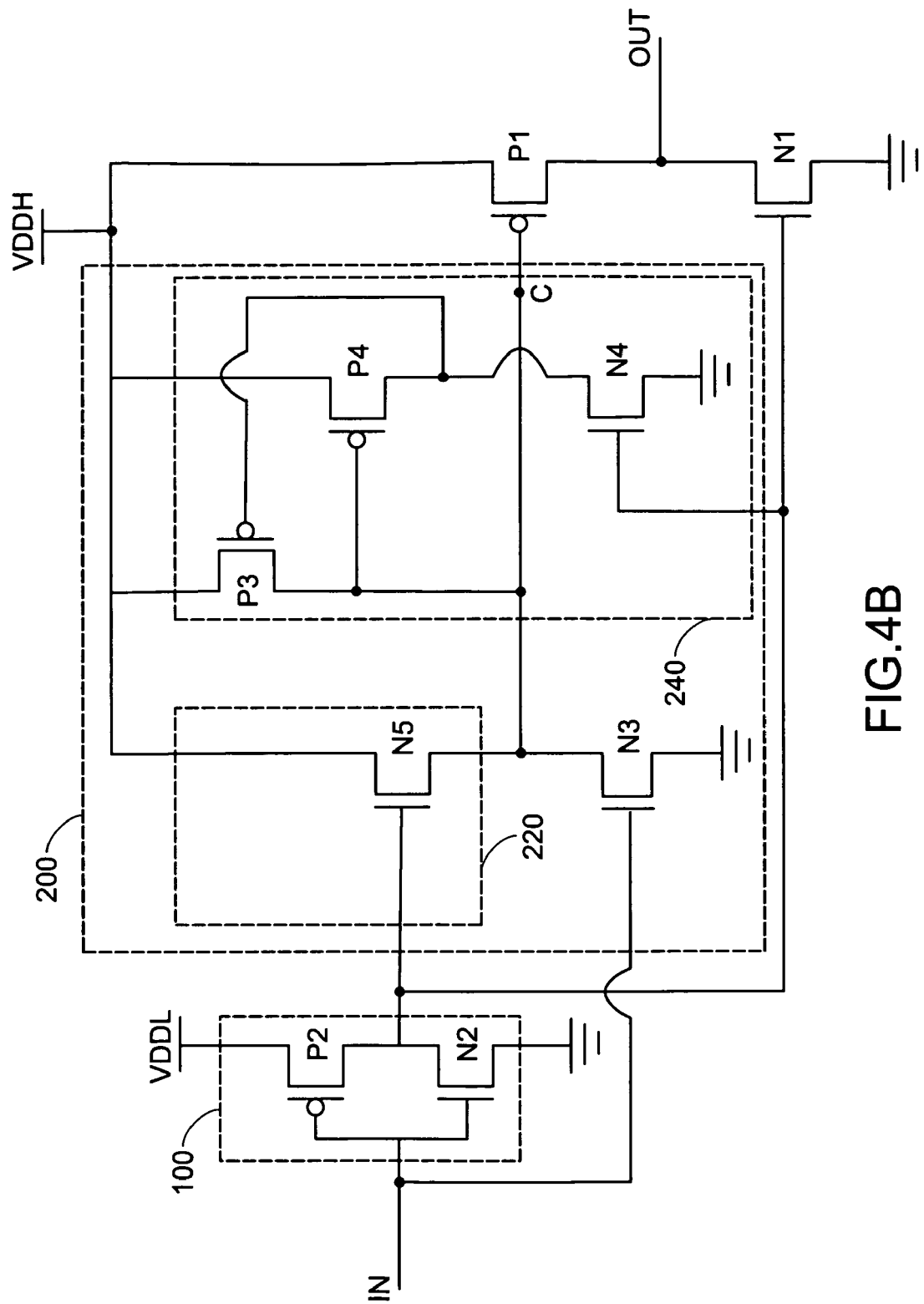
FIG. 4B is a circuit diagram illustrating a second embodiment of a control circuit applicable to the level shifter of FIG. 3.

A level shifter used with a second embodiment of the control circuit 200 is shown in FIG. 4B. In this embodiment, a racing problem reducing unit 220 is provided in addition to the leakage current preventing unit 240 and the NMOS transistor N3 as shown in FIG. 4A in order to alleviate the racing problem encountered when a level at the control end C is switched from low to high.

The racing problem reducing unit 220 includes an NMOS N5 whose drain is coupled to the high voltage source VDDH, whose gate is coupled to the output end of the Not gate 100, and whose source is coupled to the control end C. Accordingly, when the signal input IN is at the specified low level, e.g. the ground level, and the output end of the Not gate 100 is at the specified high level, e.g. equal to the level of the low voltage source VDDL, the NMOS transistor N5 is turned on fast so as to readily pull up the level at the control end C to the different high level, e.g. equal to the high voltage source VDDH, thereby reducing the racing problem resulting from the simultaneous activation with the NMOS transistor N1.

Figure 4C:
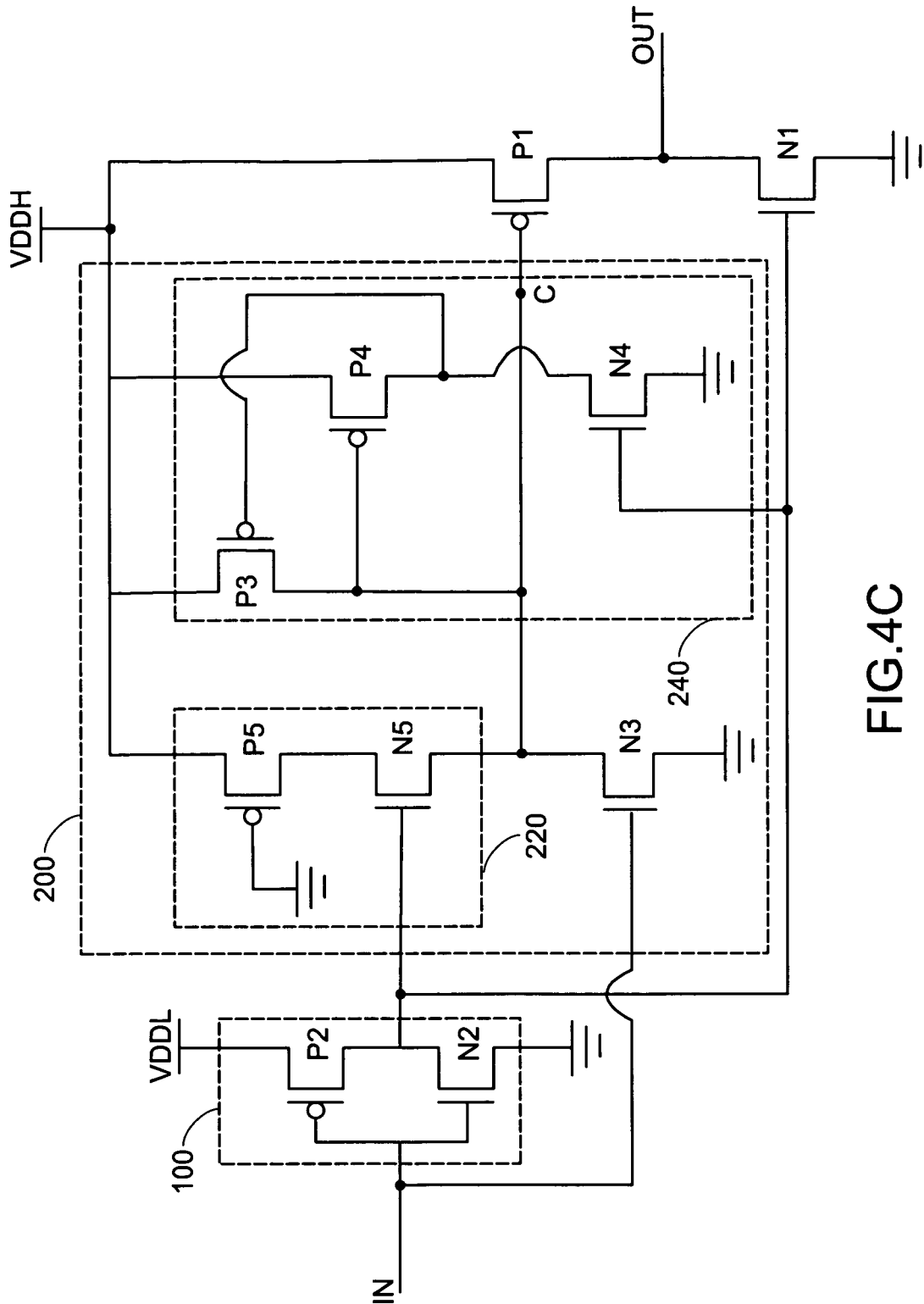
FIG. 4C is a circuit diagram illustrating a third embodiment of a control circuit applicable to the level shifter of FIG. 3.

In the above embodiment, the drain of the NMOS transistor N5 is coupled to the high voltage source VDDH, so an electrostatic discharge (ESD) path is formed with the NMOS transistor N5. For solving this problem, in a further embodiment as shown in FIG. 4C, the racing problem reducing unit 220 further includes a PMOS transistor P5 whose source is coupled to the high voltage source VDDH, whose gate is coupled to the ground, and whose drain is coupled to the drain of the NMOS transistor N5. Compared to the second embodiment, the drain of the NMOS transistor N5 in this embodiment is coupled to the drain of the PMOS transistor P5 instead of the high voltage source VDDH. Accordingly, when the signal input IN is at the specified low level, e.g. the ground level, and the output end of the Not gate 100 is at the specified high level, e.g. equal to the level of the low voltage source VDDL, the PMOS transistor P5 has been turned on and the NMOS transistor N5 is turned on fast. Therefore, the level at the control end C is readily pulled up to the different high level, e.g. equal to the high voltage source VDDH, thereby reducing the racing problem resulting from the simultaneous activation with the NMOS transistor N1. Moreover, the connection of the source of the PMOS transistor P5 to the high voltage source VDDH avoids the formation of the ESD path.

Figure 1:
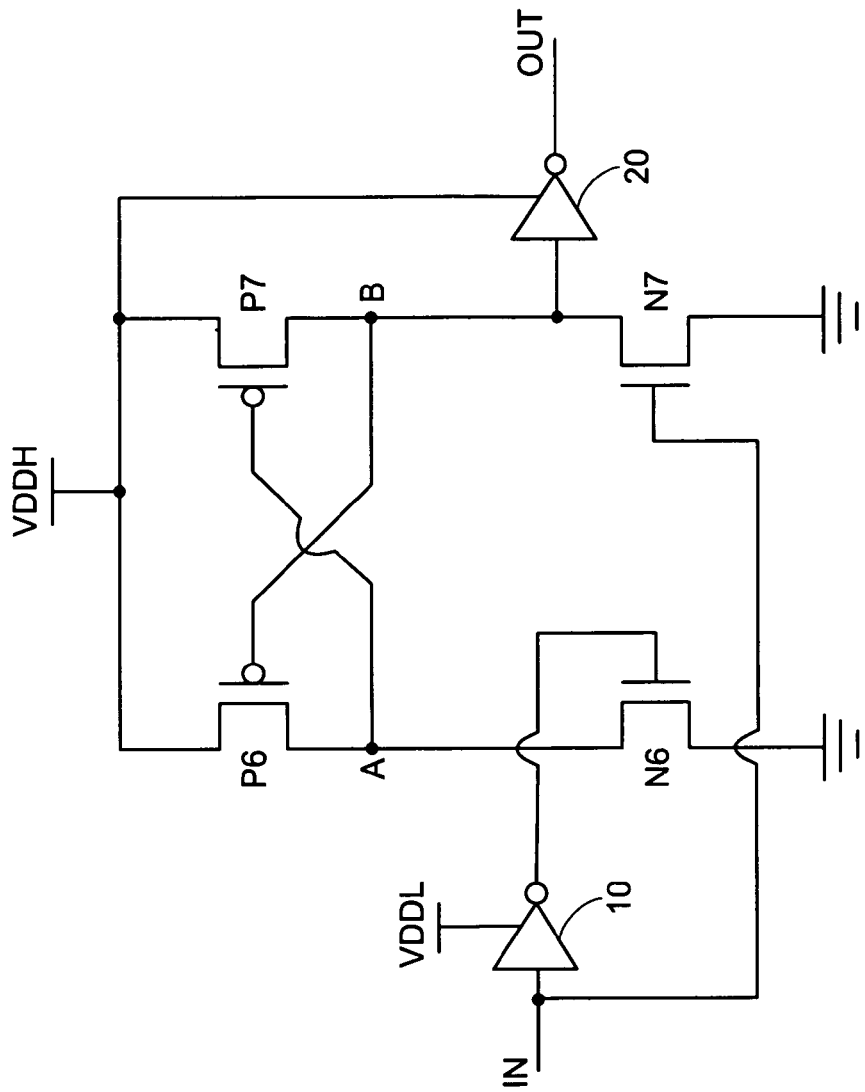
FIG. 1 is a circuit diagram of a conventional level shifter.
Figure 2:
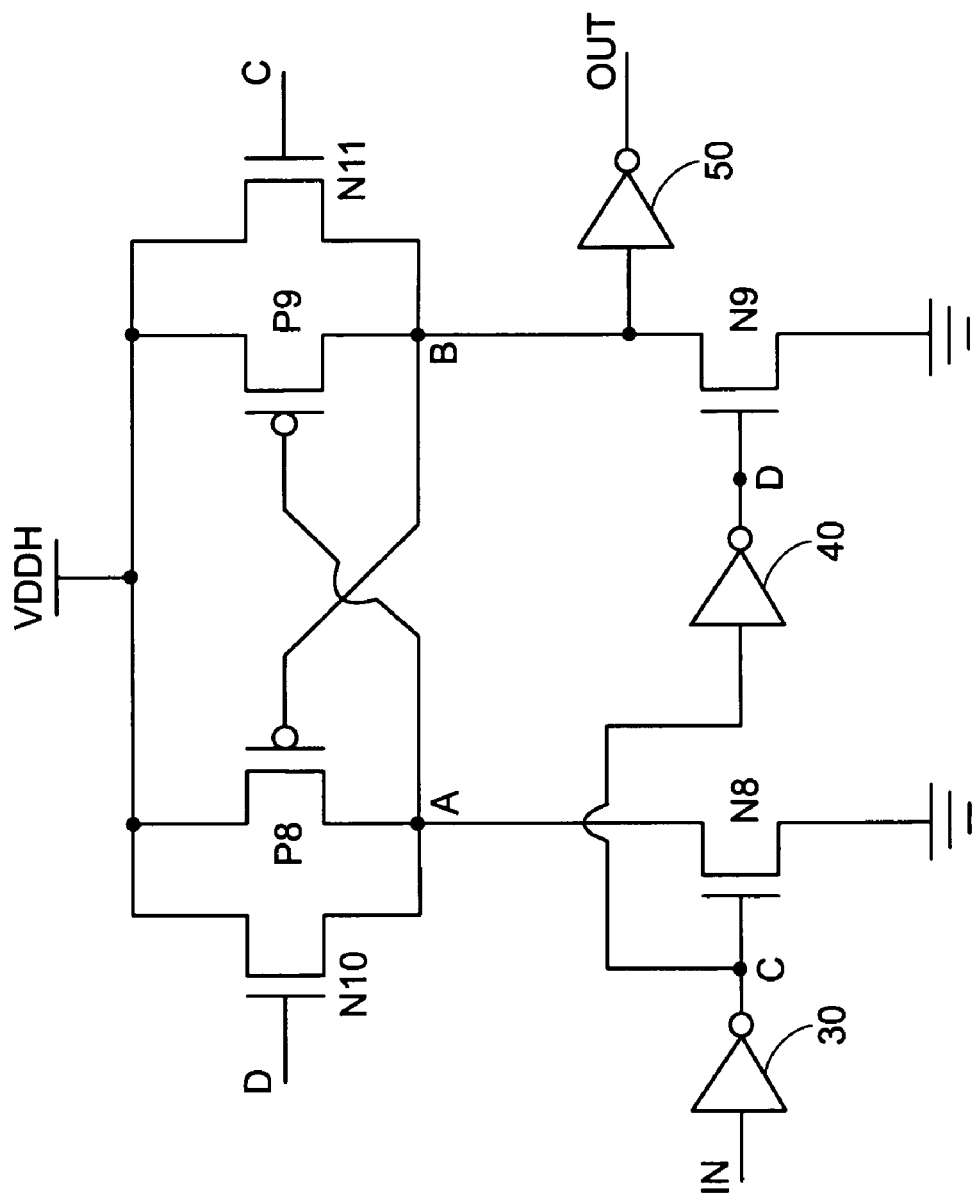
FIG. 2 is a circuit diagram of another conventional level shifter.

The performance of the present level shifter will be described hereinafter based on a variety of data. FIGS. 5~8 illustrate the comparison results of the variety of data between the present level shifter and the conventional level shifter, wherein the level shifter of FIG. 4C is used as the present level shifter and the level shifters of FIG. 1 and FIG. 2 are used as the conventional level shifter for comparison.

Figure 5:
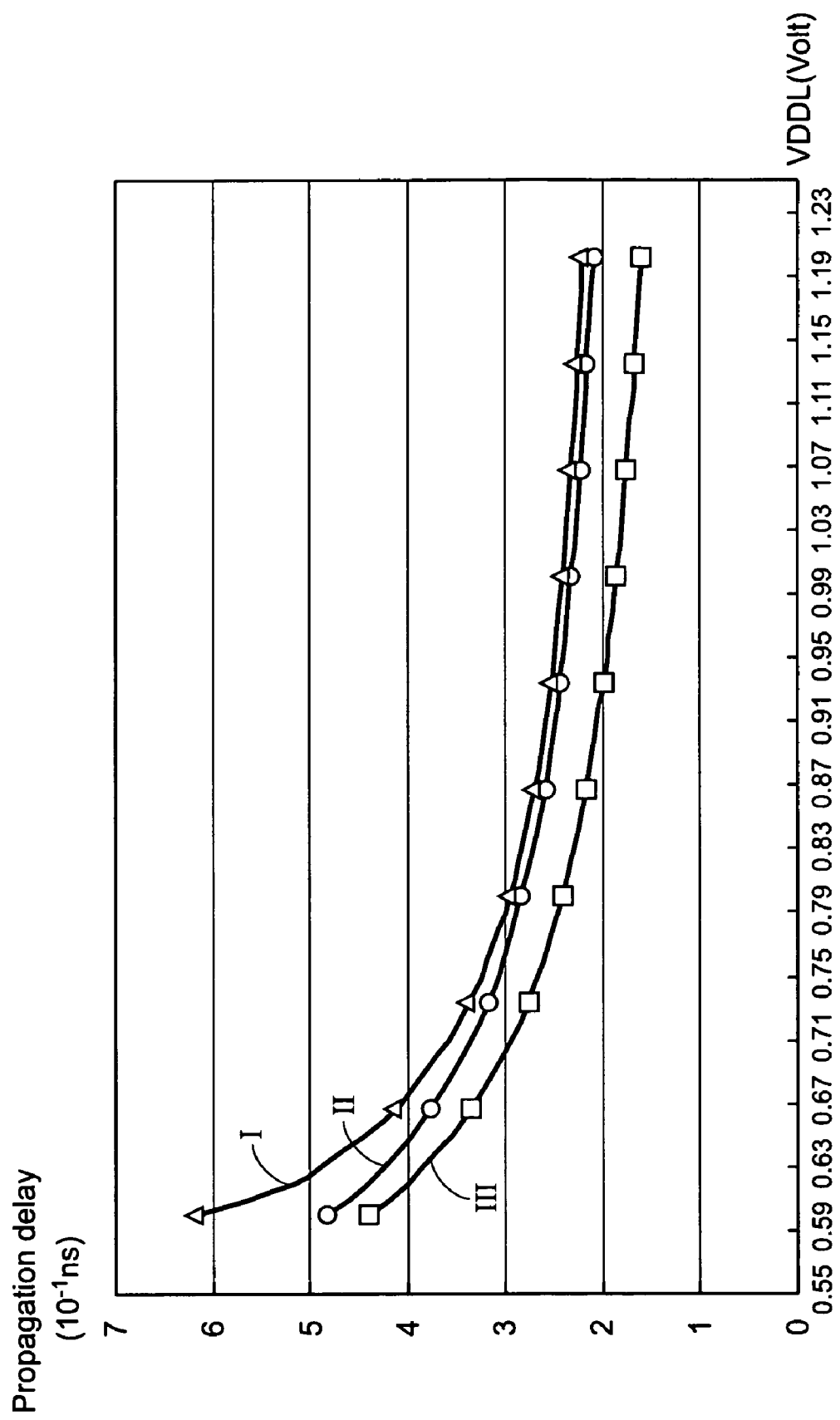
FIG. 5 is a propagation-delay vs. VDDL plot of the level shifter of FIG. 4C compared with the level shifters of FIG. 1 and FIG. 2.

Referring to FIG. 5, the propagation delay change with the level of the low voltage source VDDL is checked. When the level of the low voltage source VDDL increases from 0.6V to 1.2V, the propagation delays of all the level shifters, including that illustrated in FIG. 1 (Curve I), that illustrated in FIG. 2 (Curve II), and that illustrated in FIG. 4C (Curve III), decreases as shown. Nevertheless, the present level shifter always has the smallest propagation delay.

Figure 6:
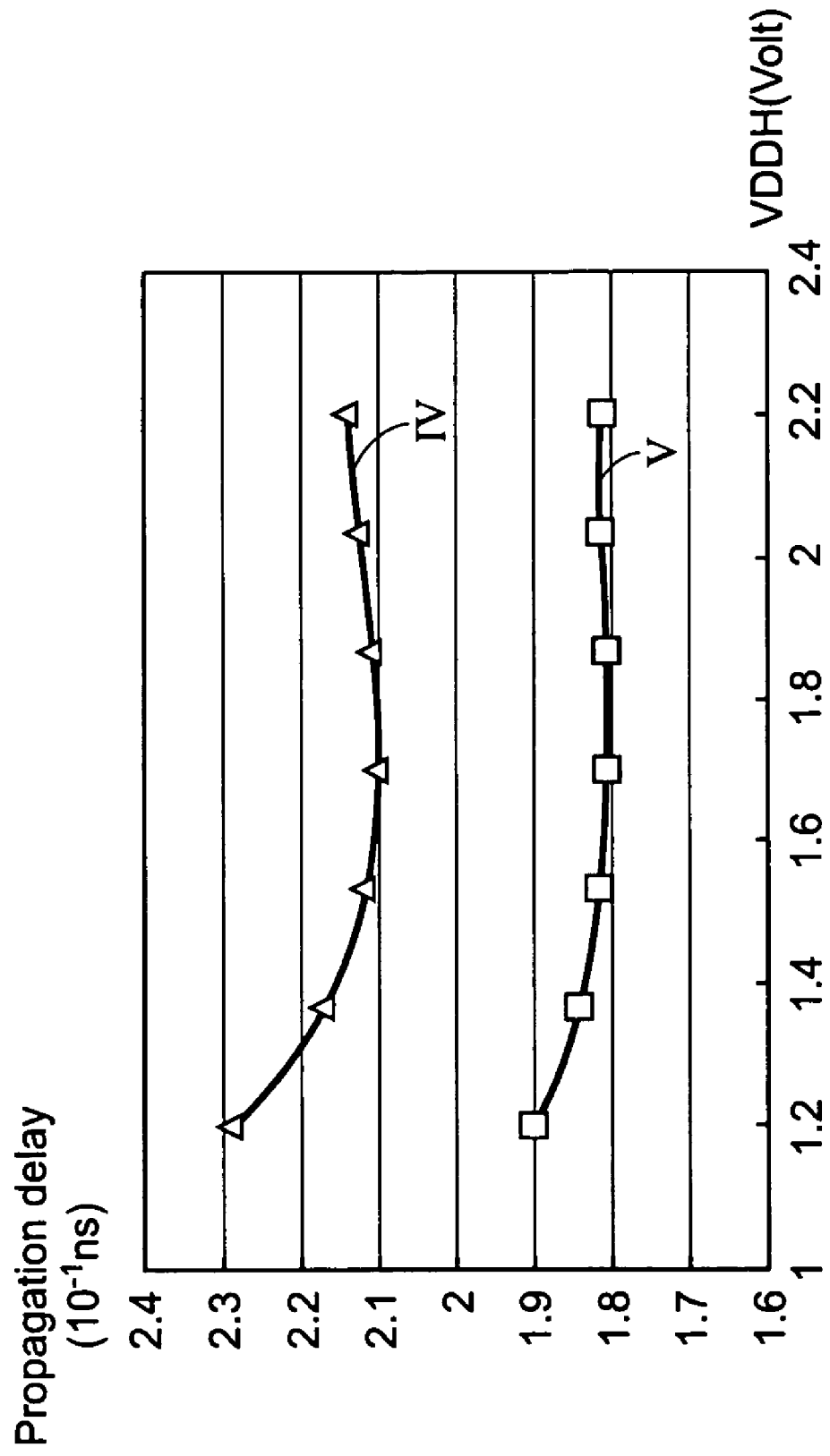
FIG. 6 is a propagation-delay vs. VDDH plot of the level shifter of FIG. 4C compared with the level shifter of FIG. 1.

Referring to FIG. 6, the propagation delay change with the level of the high voltage source VDDH is checked. When the level of the high voltage source VDDH increases from 1.2V to 2.2V, both the propagation delays, including that illustrated in FIG. 1 (Curve IV) and that illustrated in FIG. 4C (Curve V), decrease as shown. Nevertheless, the present level shifter always has the smaller propagation delay.

Figure 7:
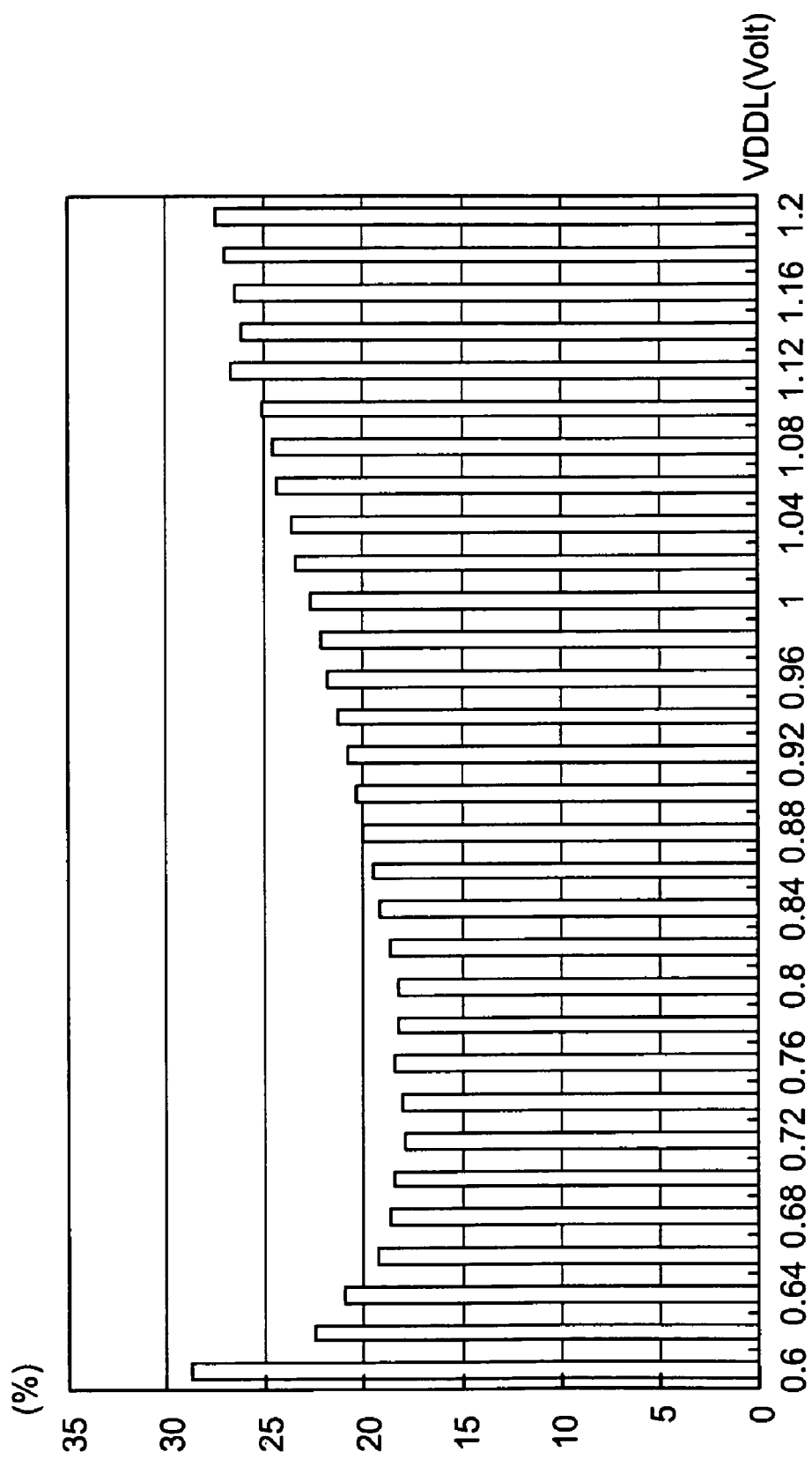
FIG. 7 is a plot showing a switching-rate increase of the level shifter of FIG. 4C compared with the level shifter of FIG. 1.

Referring to FIG. 7, the switching rate change with the level of the low voltage source VDDL is checked. As shown, when the level of the low voltage source VDDL is 0.6V, the switching rate of the present level shifter of FIG. 4C is about 28% higher than that of the conventional level shifter of FIG. 1. When the level of the low voltage source VDDL is 0.72V, the switching rate of the present level shifter is still about 17% higher than that of the conventional level shifter. In average, the switching rate of the present level shifter is about 20% higher than that of the conventional level shifter.

Figure 8:
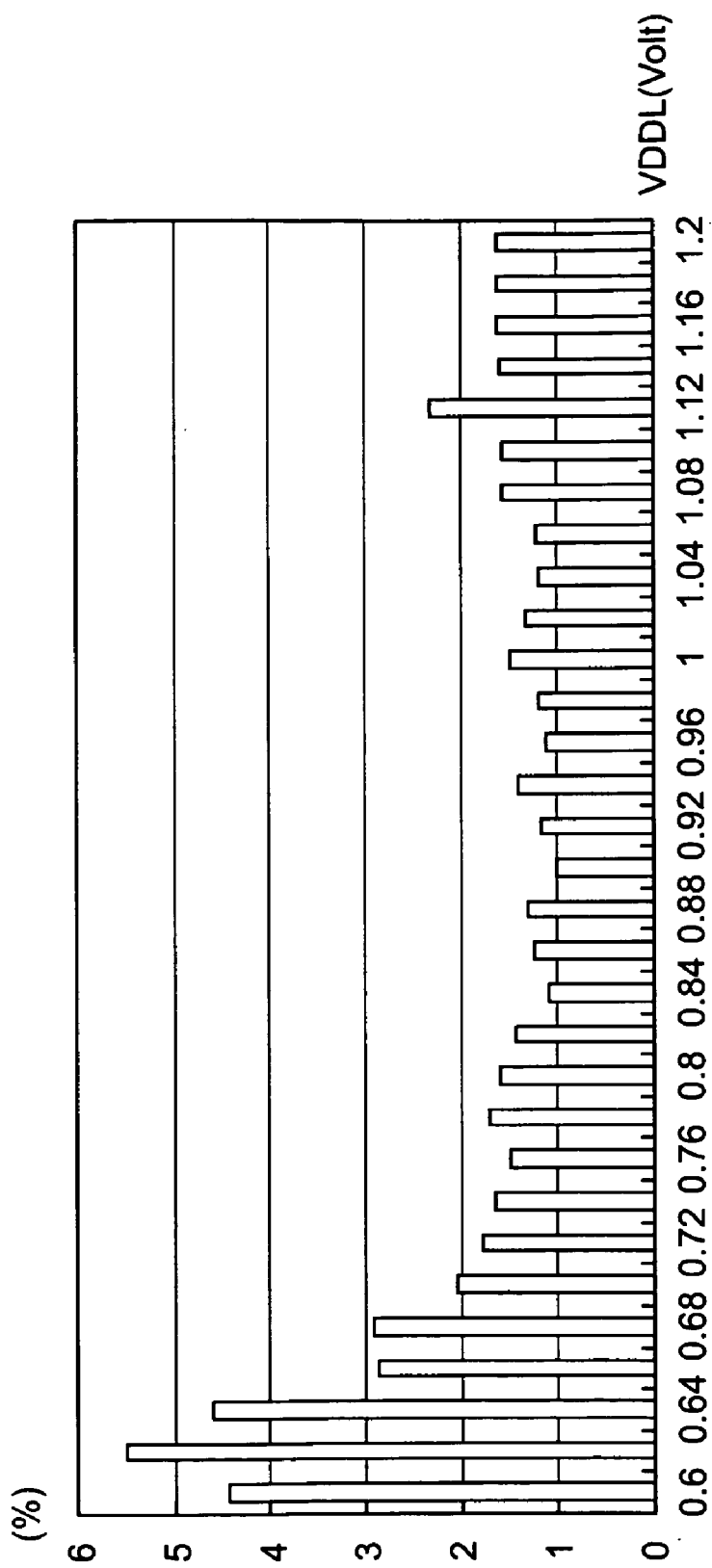
FIG. 8 is a plot showing a power-consumption reduction of the level shifter of FIG. 4C compared with the level shifter of FIG. 1.

Referring to FIG. 8, the power consumption change with the level of the low voltage source VDDL is checked. As shown, when the level of the low voltage source VDDL is 0.62V, the power consumption of the present level shifter of FIG. 4C is about 5.5% less than that of the conventional level shifter of FIG. 1. When the level of the low voltage source VDDL is 0.90V, the power consumption of the present level shifter is still about 1% less than that of the conventional level shifter. In average, the power consuption of the present level shifter is about 1.5% less than that of the conventional level shifter.

In addition to the above-mentioned features of low propagation delay and low power consumption, the present level shifter is also advantageous in layout area since the number of resistors included in the present level shifter is less than that included in the conventional level shifter of FIG. 2. Therefore, cost can be reduced. It is to be noted that the level shifters described above is exemplified for changing a level from low to high. Nevertheless, the principle of the present invention can also be applied to the change of a level from high to low through some minor and proper modifications. Since the modification is known to those skilled in the art, it is not redundantly described herein.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A level shifter for shifting a level of a signal input and outputting a signal output with the shifted level, comprising:
    a Not gate coupled to a first voltage source so to be operable between a first high level being substantially equal to a level of the first voltage source and a low level being substantially equal to a reference voltage, and having an input end coupled to the signal input;
    a first PMOS transistor having a source coupled to a second voltage source and a gate coupled to a control end;
    a first NMOS transistor having a drain coupled to the drain of the first PMOS transistor and outputting therefrom the signal output, having a gate coupled to an output end of the Not gate, and having a source coupled to the reference voltage;
    a second NMOS transistor having a gate coupled to the signal input, a drain coupled to the control end, and a source coupled to the reference voltage;
    a racing problem reducing unit coupled to the output end of the Not gate, the control end and the second voltage source, whereby the first PMOS transistor is turned off in response to a control signal from the control end when the output end of the Not gate is at the first high level, thereby obtaining the signal output at the low level; and
    a leakage current preventing unit disposed between the second voltage source and the reference voltage, whereby the first PMOS transistor is turned on in response to a control signal from the control end when the output end of the Not gate is at the low level, thereby obtaining the signal output at a second high level associated with the second voltage source.

2. The level shifter according to claim 1 wherein the reference voltage is at a ground level.

3. The level shifter according to claim 1 wherein the second high level is substantially equal to a level of the second voltage source.

4. The level shifter according to claim 1 wherein the Not gate includes:
    a second PMOS transistor having a source coupled to the first voltage source and a gate coupled to the signal input; and
    a third NMOS transistor having a drain coupled to the drain of the second PMOS transistor and serving as the output end of the Not gate, having a gate coupled to the signal input, and having a source coupled to the reference voltage.

5. The level shifter according to claim 1 wherein the leakage current preventing unit includes:
    a third PMOS transistor having a source coupled to the second voltage source;
    a fourth PMOS transistor having a source coupled to the second voltage source, a drain coupled to the gate of the third PMOS transistor, and a gate coupled to the drain of the third PMOS transistor and the control end; and
    a fourth NMOS transistor having a drain coupled to the drain of the fourth PMOS transistor, a source coupled to the reference voltage, and a gate coupled to the output end of the Not gate.

6. The level shifter according to claim 1 wherein the racing problem reducing unit includes a fifth NMOS transistor having a drain coupled to the second voltage source, a gate coupled to the output end of the Not gate, and a source coupled to the control end 7. The level shifter according to claim 1 wherein the racing problem reducing unit includes:
    a fifth PMOS transistor having a source coupled to the second voltage source; and
    a fifth NMOS transistor having a drain coupled to the drain of the fifth PMOS transistor, a gate coupled to the output end of the Not gate, and a source coupled to the control end.

8. The level shifter according to claim 7 wherein the fifth PMOS transistor having a gate coupled to the reference voltage.

* * * * *